(12) United States Patent
Muramatsu

(10) Patent No.: US 6,309,902 B1
(45) Date of Patent: Oct. 30, 2001

(54) METHOD FOR COATING SEMICONDUCTOR ELEMENT WITH RESIN, COATING RESIN, AND LIQUID CRYSTAL DISPLAY DEVICE

(75) Inventor: Eiji Muramatsu, Nagano (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 09/051,411

(22) PCT Filed: Aug. 7, 1997

(86) PCT No.: PCT/JP97/02763

§ 371 Date: Apr. 7, 1998

§ 102(e) Date: Apr. 7, 1998

(87) PCT Pub. No.: WO98/07065

PCT Pub. Date: Feb. 19, 1998

(30) Foreign Application Priority Data

Aug. 8, 1996 (JP) .................................................. 8-210333

(51) Int. Cl.[7] ................................................... H01L 21/00
(52) U.S. Cl. ................................ 438/30; 438/25; 438/26; 438/124; 438/126; 438/127
(58) Field of Search .................................. 438/15, 25, 26, 438/51, 55, 30, 106, 112, 124, 126, 127; 257/787, 790

(56) References Cited

U.S. PATENT DOCUMENTS

| | | | |
|---|---|---|---|
| 4,641,925 | * | 2/1987 | Gasparaitis et al. ............... 350/345 |
| 5,365,356 | * | 11/1994 | McFadden ........................... 359/62 |
| 5,387,445 | * | 2/1995 | Horiuchi et al. .................... 428/1 |
| 5,670,797 | * | 9/1997 | Okazaki ............................... 257/91 |
| 5,680,185 | * | 10/1997 | Kobayashi et al. ................. 349/88 |
| 5,804,126 | * | 9/1998 | Karunaratne et al. ........... 264/328.5 |
| 5,818,561 | * | 10/1998 | Nakanishi ............................ 349/149 |
| 5,866,953 | * | 2/1999 | Akram et al. ....................... 257/790 |
| 5,972,739 | * | 10/1999 | Funada et al. ...................... 438/127 |

FOREIGN PATENT DOCUMENTS 2-241041   9/1990   (JP) .

OTHER PUBLICATIONS

James J. Licari, Plastic Coatings for Electronics, 1970, pp. 125.*

Charles A. Harper, Electronic Packaging and Interconnection Handbook, 1991, pp. 1.3–1.7.*

* cited by examiner

Primary Examiner—Eddie Lee
Assistant Examiner—N. Drew Richards
(74) Attorney, Agent, or Firm—Harness, Dickey & Pierce, P.L.C.

(57) ABSTRACT

It is an object of this invention to provide a method for simply and quickly covering a semiconductor device with a coating resin. In the method for covering a semiconductor device 2 used for a liquid crystal panel 1 with a coating resin, a coating resin 14 being formed as a layer, the coating resin 14 is placed around the semiconductor device 2, and the semiconductor device 2 and its surroundings are covered with the coating resin 14 by curing the coating resin 14 so as to be protected from moisture. The coating resin 14 may be a coating resin which is curable through a chemical reaction by heating or an ultraviolet curing type resin or the like. If the coating resin 14 has a through-hole 16 or concavity so as to receive the semiconductor device 2, the position of the coating resin 14 to the semiconductor device 2 can always be set at a fixed position.

37 Claims, 4 Drawing Sheets

METHOD FOR COATING SEMICONDUCTOR ELEMENT WITH RESIN, COATING RESIN, AND LIQUID CRYSTAL DISPLAY DEVICE

TECHNICAL FIELD

The present invention relates to a method for covering a semiconductor device with a coating resin, a coating resin and a liquid crystal display device.

BACKGROUND ART

In a liquid crystal display device, liquid crystal is encapsulated between one pair of opposing substrates provided with electrodes, the alignment of the liquid crystal is controlled by controlling an applied voltage to electrodes to modulate light, and thus, visible images, such as numerals, letters, graphics and so forth are displayed on the substrate surface. The voltage applied to electrodes is generally controlled by a driver IC which corresponds to a semiconductor device. If the driver IC and its connecting parts are exposed to moisture, their electrical characteristics may deteriorate.

In general, in order to protect a driver IC and its connective parts from being exposed to moisture, the driver IC and its connective parts are coated with a coating resin. For example, in a COG (Chip On Glass) type liquid crystal panel 1, as shown in FIG. 5, a method for coating a driver IC 2 used therein, its surroundings and exposed transparent electrodes with a coating resin, generally comprises the steps of applying a coating resin R around the driver IC 2 by translating a tube 51 along a substrate 4 as shown by an arrow A while squeezing the coating resin R out of the tube 51 which contains a liquid coating resin, and then drying the coating resin R after a period of time.

The conventional method for resin coating, however, requires a long time to dry and solidify a coating resin, resulting in a significantly low productivity. Also, a unit for squeezing a given volume of the coating resin R out of the tube 51 and a unit for translating the tube 51 are required, resulting in a high cost of equipment.

The present invention has been completed in view of the foregoing problems and it is an object of this invention to provide a method for simply and quickly covering a semiconductor device used for a liquid crystal display device with a resin.

DISCLOSURE OF INVENTION

In order to achieve the above-mentioned object, a method for covering a semiconductor device with a resin, in accordance with this invention, comprises the steps of forming a layered coating resin, placing the coating resin around the semiconductor device, and curing the coating resin to cover the semiconductor device.

As a coating resin, a coating resin which is curable through a chemical reaction by heating, for example, an olefinic copolymer resin may be used, and in such a case, the coating resin can be cured by heating at temperatures of approximately from 60° C. to 80° C. for approximately 30 minutes, and then it can be adhered to an adherend by cooling at room temperature for approximately 10 minutes. As the environmental temperature increases, the coating resin softens so that its corners are smoothly rounded, and then, it will have a predetermined hardness by leaving it to stand at room temperature for a given time. Once it is cured, it will not melt by heating at a temperature of approximately 80° C., more specifically it will not melt at temperatures of 120° C. to 140° C.

Preferably, a coating resin to be used may be selected appropriately so that the heating temperature is set at approximately 80° C. because it is preferable to protect the liquid crystal from being exposed to a high temperature when this method is applied to a liquid crystal display device.

In the present invention, an UV (ultraviolet) curing type resin may be used as an alternative to the above-mentioned thermoset resin. The ultraviolet curing type resin is cured when irradiated with ultraviolet rays, and generally it is cured by ultraviolet energy of approximately 1,000 mJ.

In the resin coating method having the above composition, in accordance with the present invention, the mechanical working conducted by a worker or machinery includes only placing the coating resin on the semiconductor device, and the current work of applying a coating resin onto a substrate is no longer required. Accordingly, the workflow is simplified, and moreover no particularly complicated unit is required.

Since the liquid coating resin is not cured by drying, but the coating resin is cured either by heating through a chemical reaction or by employing a curing treatment such as ultraviolet curing, the coating resin can be cured around the semiconductor device in a very short time.

It is preferable to form a through-hole or concavity on the coating resin so that a semiconductor device can be placed. In such a manner, the coating resin is always automatically placed on a fixed position including the semiconductor device, and thus there is no deviation from the position of the coating resin on the semiconductor device.

The resin coating method in accordance with the present invention can be applied to a liquid crystal display device having any configuration. As described in Claim 6, however, this method is particularly beneficial to what is called a COG-type liquid crystal display device in which a semiconductor device is directly fixed onto a glass substrate, because the coating resin easily adheres to the glass substrate.

Also, in accordance with the present invention, the coating resin for covering the semiconductor device is formed as a layer. Preferably, the coating resin has a through-hole or concavity so as to place the semiconductor device.

Also, the liquid crystal display device, in accordance with the present invention, comprises one pair of substrates facing each other with liquid crystal enclosed therebetween and a semiconductor device which is directly joined to at least one substrate, wherein the coating resin is formed as a layer, the coating resin is arranged around the semiconductor device, and the semiconductor device is coated by curing the coating resin.

BEST MODE FOR CARRYING OUT THE INVENTION (First Embodiment)

Figure 3:
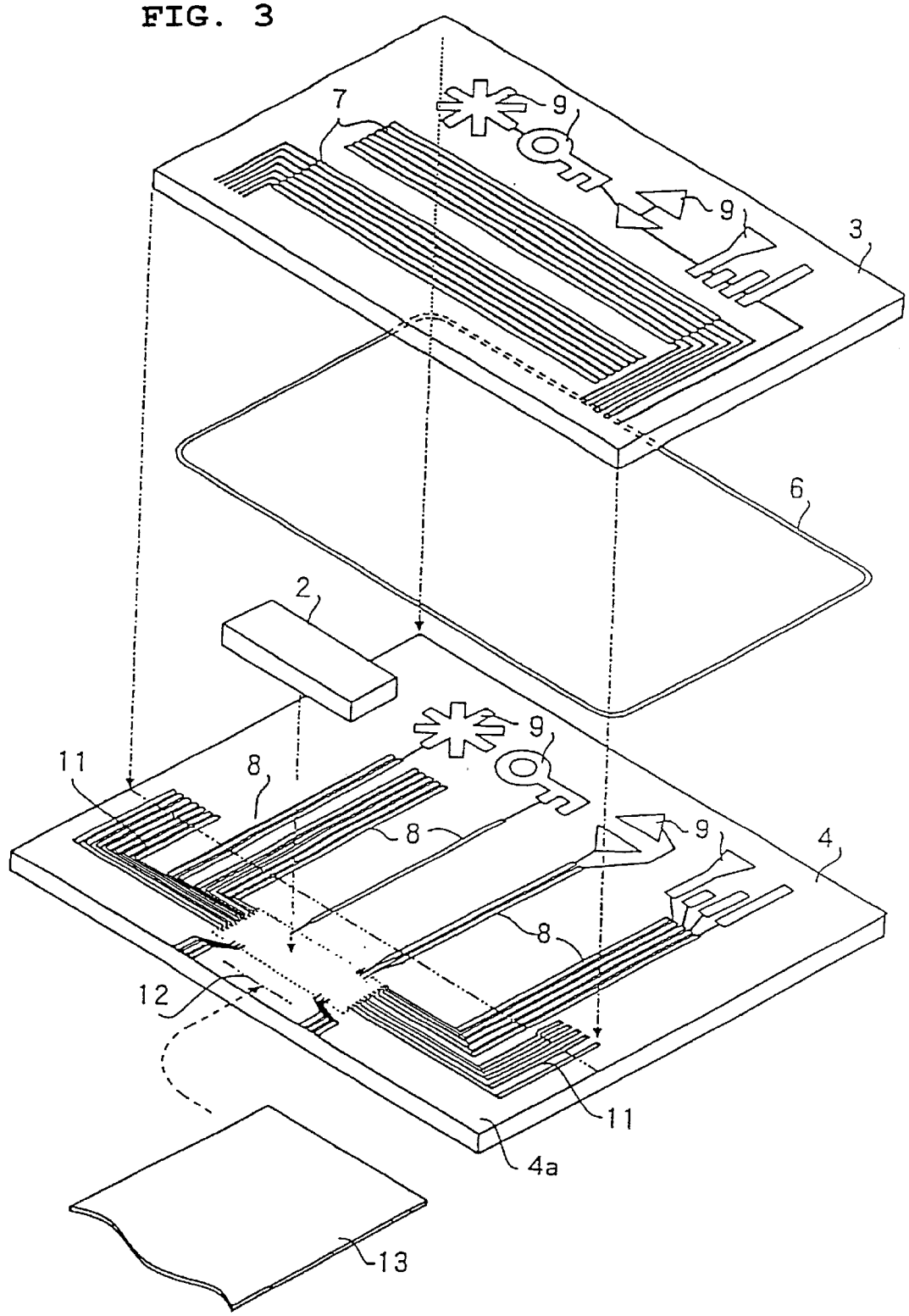
FIG. 3 is an assembly view which shows an embodiment of a liquid crystal panel to which a method for covering a semiconductor device with a resin in accordance with this invention can be applied.

FIG. 3 shows an example of a liquid crystal panel to which a resin coating method of a semiconductor device in accordance with this invention can be applied and the liquid crystal panel is of a COG-type. The liquid crystal panel is fabricated by bonding a first substrate 3 comprising transparent glass and a second substrate 4 also comprising transparent glass together with an annular sealing material 6, and by filling the space provided between the substrates 3 and 4, a so-called cell-gap, with liquid crystal. On the surfaces of the substrates 3 and 4, striped electrodes 7 and striped electrodes 8, respectively, are formed, and specially patterned electrodes 9 are formed. These electrodes are composed of ITO, tin oxide, and other materials for transparent electrodes. In this liquid crystal panel, a plurality of pixels are arranged in a matrix at crossing points of the striped electrodes 7 and the striped electrodes 8, and the specially patterned electrodes 9 display special symbols to show specific functions.

The second substrate 4 includes a protruded part 4a which protrudes from the first substrate 3, on which IC output wires 11 and IC input wires 12 are formed on the surface. The IC output wires 11 connect output terminals of a driver IC 2 as a semiconductor device with the electrodes 7, 8, and 9, while the IC input wires 12 connect input terminals of the driver IC 2 with an external circuit substrate (not shown in the drawing).

First, the first substrate 3 and the second substrate 4 are bonded together with the sealing material 6 therebetween, and liquid crystal is filled into the cell-gap. Then, the driver IC 2 is bonded mechanically and electrically on the protruded part 4a of the second substrate 4 through, for example, an ACF (Anisotropic Conductive Film). Also, a FPC (Flexible Printed Circuit) 13 is bonded to the IC input wires 12 of the second substrate 4 through, for example, an ACF.

Figure 1:
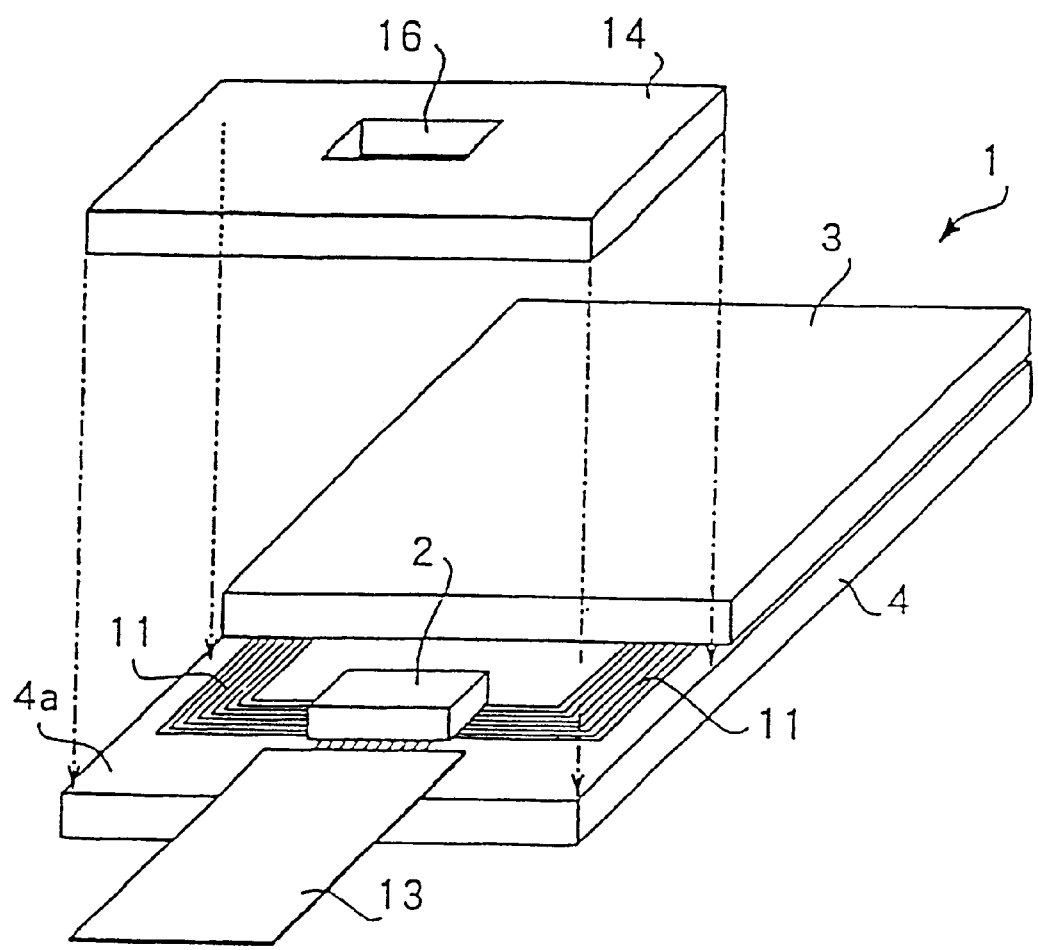
FIG. 1 is a perspective view showing a method for covering a semiconductor device with a resin in accordance with this invention.

FIG. 1 shows the liquid crystal panel 1 fabricated as described above. The driver IC 2 provided on the protruded part 4a of the second substrate 4 in the liquid crystal panel 1 must be protected from moisture, therefore, it is treated with resin coating as follows.

First, as shown in FIG. 1, a layered coating resin 14, which has the same size as that of the protruded part 4a of the second substrate 4, is prepared. The coating resin 14, composed of a resin which is cured through a chemical reaction by heating, for example, an olefinic copolymer resin, has a thickness which substantially corresponds to the height of the driver IC 2. Also, a rectangular through-hole 16 which is slightly larger than the driver IC 2 is formed in the center of the coating resin 14.

Figure 2:
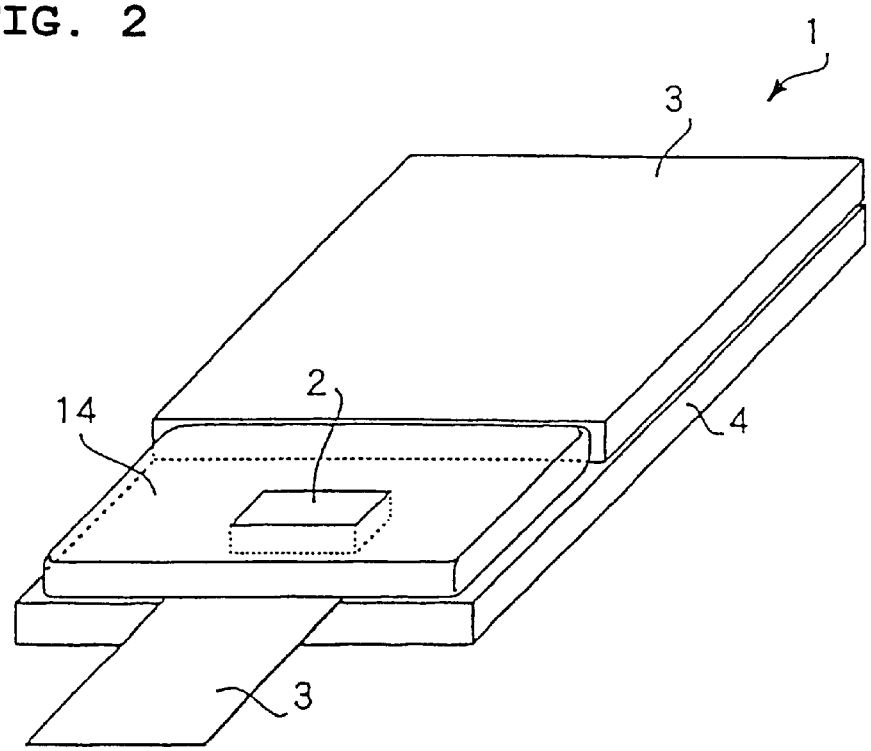
FIG. 2 is a perspective view of an embodiment of a liquid crystal panel fabricated by a method for covering a semiconductor device with a resin in accordance with this invention.

The coating resin 14 is placed on the protruded part 4a of the second substrate 4 while the driver IC 2 fits into the through-hole 16, and then it is heated at a given temperature, for example, from 60° C. to 80° C., for a given time, for example, approximately 30 minutes. By the heating, the coating resin 14 is cured and bonded to the substrate 4. Next, the resin 14 is left at room temperature for a given time, for example, approximately 10 minutes until the resin 14 is solidified and fixed firmly to the sides of the driver IC 2, and thus the resin coating treatment to the driver IC 2 of the liquid crystal panel 1 is completed as shown in FIG. 2. Further, although, in this embodiment, the top face of the driver IC 2 remains exposed without being covered with the coating resin 14 at the completion of the coating, the top face may be coated with the coating resin 14.

Figure 5:
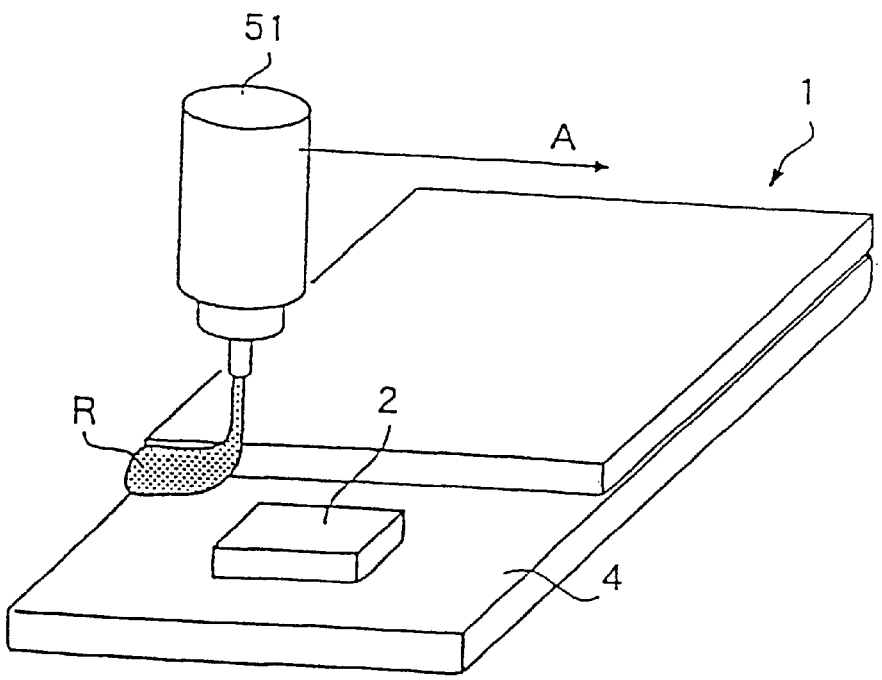
FIG. 5 is a perspective illustration which shows an embodiment of a conventional method for covering a semiconductor device with a resin.

In accordance with the resin coating treatment described above, the mechanical working conducted by a worker or machinery includes only an extremely simple step of placing the coating resin 14 on the protruded part 4a of the second substrate 4, therefore, in comparison with applying a liquid resin in the conventional treatment as shown in FIG. 5, the work is carried out simply and reliably. Also, since the coating resin is cured and solidified through a chemical reaction by heating, in comparison with solidifying a liquid resin by drying, the solidification time can be significantly shortened. Also, since the driver IC 2 fits in the through-hole 16, the position of the coating resin 14 to the driver IC 2 can always be set at a fixed position, and consequently a liquid crystal panel with a stable quality can be obtained.

Figure 4:
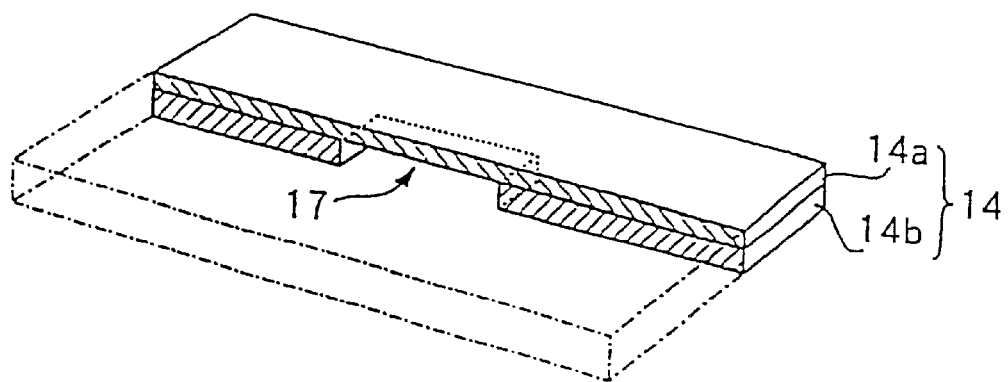
FIG. 4 is a perspective view of another embodiment of a layered coating resin.

Further, in FIG. 1, the layered coating resin 14 does not necessarily require the through-hole 16 to place the driver IC 2 and it can be a simple layer material having a uniform thickness. In such a case, however, attention must be paid since the position of the coating resin 14 to the driver IC 2 may be shifted. Also, as an alternative to the through-hole 16, a rectangular concavity 17 as shown in FIG. 4 can be formed on the coating resin 14 and the driver IC 12 can be placed in the concavity 17 when the coating resin 14 is placed on the substrate. Further, in FIG. 4, a layer of coating resin 14b having a through-hole is laminated with another coating resin 14a to form a concavity 17 on the layered coating resin 14.

(Second Embodiment)

In the first embodiment described above, the coating resin 14 is composed of a thermoset resin such as an olefinic copolymer resin. In the second embodiment, instead, an UV (ultraviolet) curing type resin forms the coating resin 14.

In this embodiment, for example, as shown in FIG. 1, the coating resin 14 composed of an UV curing type resin is placed on a protruded part 4a of a second substrate 4 so that a driver IC 2 fits into a through-hole 16, and then the coating resin 14 is irradiated with ultraviolet rays to be cured. At this stage, the ultraviolet light radiation energy is approximately 1,000 mJ. In accordance with this embodiment, a semiconductor device can be covered with a coating resin also in a short time by an extremely simple process.

(Other Embodiments)

The preferred embodiments of this invention have been described as above. This invention, however, is not limited to the embodiments and various alterations can be made within the scope of the technical fields described in the claims.

In the above-mentioned embodiments, the present invention is applied to a COG-type liquid crystal panel, however, the present invention can also be applied to any liquid crystal panels having other configurations.

Further, in the embodiment described above, a resin coating is treated after bonding the FPC 13 to the second substrate 4. Instead, a resin coating treatment to the driver IC can be given before bonding the FPC 13 and at the completion of the resin coating treatment the FPC 13 can be bonded to the substrate 4.

Further, this invention can be applied not only to a liquid crystal panel, but also to a configuration of an electronic device having a semiconductor device mounted on a substrate, which is coated with a resin.

In the resin coating method of the semiconductor device in accordance with this invention, the only simple work is to place the coating resin on the substrate fixed with the semiconductor device, and no complicated unit is required for performing the work. Also, the work can be done in a shorter time in comparison with the current method which requires a step of applying a liquid resin.

Also, in comparison with the current method of curing the liquid resin by drying, the time required to cure the coating resin can be shortened considerably.

Further, the position of the coating resin to the semiconductor device can always be automatically set at a fixed position.

Furthermore, the resin coating method of the semiconductor device in accordance with the present invention assumes a case when the present invention is applied to a so-called COG-type liquid crystal display device. In a COG-type liquid crystal display device, since a semiconductor device is directly bonded on a glass substrate, a coating resin to cover the semiconductor device is irradiated with ultraviolet rays or treated with heat while being placed on the glass substrate. Since the coating resin easily adheres to the glass substrate, the coating resin, in accordance with this invention, can be bonded on the substrate in a short time accurately.

Industrial Applicability

As described above, the present invention is useful for covering a semiconductor device simply and quickly with a resin, and is particularly suitable for mounting a so-called COG-type semiconductor device in which a semiconductor device is directly fixed on a glass substrate.

What is claimed is:

1. A method for providing a liquid crystal display device having a semiconductor device, the method comprising the steps of:
   providing a first substrate having a first electrode formed thereon;
   providing a second substrate having a second electrode formed thereon;
   mounting said second substrate onto said first substrate having a protruded part, said protruded part projecting outwardly relative to said second substrate, wherein said protruded part has a first wire connected to said first electrode, a second wire connected to said second electrode and an input wire formed thereon;
   securing said semiconductor device to said protruded part such that said semiconductor device is spaced apart from said second substrate, wherein each of said first wire, said second wire and said input wire connects to said semiconductor device;
   forming a discrete coating resin sheet including a through-hole having a certain size which enables said semiconductor device to fit in, wherein said discrete coating resin sheet has length and width dimensions that are substantially the same as said protruded part, and a thickness that is substantially the same as said semiconductor device;
   placing said discrete coating resin sheet on said protruded part around said semiconductor device so as to fit said semiconductor device into said through-hole, wherein said discrete coating resin sheet covers each of said first wire, said second wire and said input wire; and
   curing said layer discrete coating resin sheet onto said substrate so as to prevent said semiconductor from being infiltrated with moisture.

2. The method of claim 1 further comprising overcoating a top surface of said semiconductor device exposed through said through hole with another coating resin layer.

3. The method of claim 1 wherein said discrete coating resin sheet includes a cavity formed therein for accommodating said semiconductor device.

4. The method of claim 1 wherein said curing step further comprises:
   heating said discrete coating resin sheet to a given temperature for a given time to cure and bond said discrete coating resin sheet to said substrate.

5. The method of claim 4 wherein said given temperature is a temperature in a range of 60° C. to 80° C.

6. The method of claim 4 wherein said given time is approximately equal to 30 minutes.

7. The method of claim 4 further comprising the step of cooling said coating resin at room temperature for approximately 10 minutes.

8. The method of claim 4 wherein said coating resin further comprises a thermoset resin.

9. The method of claim 8 wherein said thermoset resin further comprises an olefinic copolymer.

10. The method of claim 1 wherein said curing step further comprises irradiating said coating resin with ultraviolet rays.

11. The method of claim 10 wherein said irradiation step is conducted at an energy level of approximately 1000 mJ.

12. The method of claim 1 wherein a liquid crystal material is disposed between said first substrate and said second substrate.

13. A method for providing a liquid crystal display device having a semiconductor device, the method comprising the steps of:
   providing a first substrate having a first electrode formed thereon;
   providing a second substrate having a second electrode formed thereon;
   mounting said second substrate onto said first substrate having a protruded part, said protruded part projecting outwardly relative to said second substrate, wherein said protruded part has a first wire connected to said first electrode, a second wire connected to said second electrode and an input wire formed thereon;
   securing said semiconductor device to said protruded part such that said semiconductor device is spaced apart from said second substrate, wherein each of said first wire, said second wire and said input wire connects to said semiconductor device;
   forming a discrete coating resin sheet including a through-hole having width and length dimensions that are substantially the same as said semiconductor device, wherein said discrete coating resin sheet has length and width dimensions that are substantially the same as said protruded part and a thickness that is substantially the same as said semiconductor device;
   placing said discrete coating resin sheet on said protruded part around said semiconductor device, wherein said discrete coating resin sheet covers each of said first wire, said second wire and said input wire;
   heating said discrete coating resin sheet to a temperature in a range of 60° C. to 80° C. for approximately 30 minutes so as to prevent said semiconductor from being infiltrated with moisture; and
   cooling said discrete coating resin sheet at room temperature for approximately 10 minutes.

14. A method for providing a liquid crystal display device having a semiconductor device, the method comprising the steps of:
   providing a first substrate having a first electrode formed thereon;
   providing a second substrate having a second electrode formed thereon;

mounting said second substrate onto said first substrate having a protruded part, said protruded part projecting outwardly relative to said second substrate, wherein said protruded part includes a first wire connected to said first electrode, a second wire connected to said second electrode and an input wire formed thereon;

securing said semiconductor device to said protruded part such that said semiconductor device is spaced apart from said second substrate, wherein each of said first wire, said second wire and said input wire connects to said semiconductor device;

forming a discrete coating resin sheet including a through-hole having a certain size which enables said semiconductor to fit in;

placing said discrete coating resin sheet on said protruded part around said semiconductor after said discrete coating resin sheet is formed, wherein said discrete coating resin sheet covers each of said first wire, said second wire and said input wire; and curing said discrete coating resin sheet onto said substrate so as to prevent said semiconductor from being infiltrated with moisture.

15. The method of claim 14, wherein said semiconductor firer includes an input terminal for connecting with said input wire of said protruded part in order to provide a connection between said semiconductor device and an external device.

16. The method of claim 14, wherein said semiconductor further includes output terminals for connecting with said first wire and said second wire of said protruded part in order to provide connections between said semiconductor and said first and second substrates via said first and second electrodes.

17. The method of claim 14, wherein said discrete coating resin sheet prevents said first wire, said second wire and said input wire from being infiltrated with moisture by covering said protruded part of said first substrate.

18. The method of claim 14, wherein said discrete coating resin sheet has length and width dimensions that are substantially the same as said protruded part, and a thickness that is substantially the same as said semiconductor device.

19. The method of claim 14 further comprising the step of overcoating a top surface of said semiconductor device exposed through said through hole with another coating resin layer.

20. The method of claim 14, wherein said curing step further comprises:

heating said discrete coating resin sheet to a given temperature for a given time to cure and bond said discrete coating resin sheet to said substrate.

21. The method of claim 20, wherein said given temperature is a temperature in a range of 60° C. to 80° C.

22. The method of claim 20, wherein said given time is approximately equal to 30 minutes.

23. The method of claim 14, further comprising the step of cooling said coating resin at room temperature for approximately 10 minutes.

24. The method of claim 14, wherein said coating resin further comprises a thermoset resin.

25. The method of claim 24, wherein said thermoset resin further comprises an olefinic copolymer.

26. The method of claim 14, wherein said curing step further comprises irradiating said coating resin with ultraviolet rays.

27. The method of claim 26, wherein said irradiation step is conducted at an energy level of approximately 1000 mJ.

28. A method for coving a semiconductor device with a coating resin according to claim 11, wherein said semiconductor further includes an input terminal for connecting with said input wire of said protruded part in order to provide a connection between said semiconductor device and an external device.

29. A method for coving a semiconductor device with a coating resin according to claim 11, wherein said semiconductor further includes output terminals for connecting with said first wire and said second wire of said protruded part in order to provide connections between said semiconductor and said first and second substrates via said first and second electrodes.

30. A method for coving a semiconductor device with a coating resin according to claim 11, wherein said discrete coating resin sheet prevents said first, second and input wires from being infiltrated with moisture by covering said protruded part of said first substrate.

31. The method of claim 13, wherein said semiconductor further includes an input terminal for connecting with said input wire of said protruded part in order to provide a connection between said semiconductor device and an external device.

32. The method of claim 13, wherein said semiconductor further includes output terminals for connecting with said first wire and said second wire of said protruded part in order to provide connections between said semiconductor and said first and second substrates via said first and second electrodes.

33. The method of claim 13, wherein said discrete coating resin sheet prevents said first wire, said second wire and said input wire from being infiltrated with moisture by covering said protruded part of said first substrate.

34. The method of claim 13, wherein said coating resin further comprises a thermoset resin.

35. The method of claim 34, wherein said thermoset resin further comprises an olefinic copolymer.

36. The method of claim 13 further comprises a step of irradiating said coating resin with ultraviolet rays.

37. The method of claim 36, wherein said irradiation step is conducted at an energy level of approximately 1000 mJ.

* * * * *

UNITED STATES PATENT AND TRADEMARK OFFICE
CERTIFICATE OF CORRECTION

PATENT NO.    : 6,309,902 B1
DATED         : October 30, 2001
INVENTOR(S)   : Eiji Muramatsu It is certified that error appears in the above-identified patent and that said Letters Patent is hereby corrected as shown below:

Title page,
Title should be -- METHOD FOR RESIN COATING OF SEMICONDUCTOR DEVICE, COATING RESIN, AND LIQUID CRYSTAL DISPLAY DEVICE --.

Column 7,
Line 25, "firer" should read -- further --.

Column 8,
Line 13, "coving" should be -- covering --.
Line 14, "claim 11" should be -- claim 1 --.
Line 19, "coving" should be -- covering --.
Line 20, "claim 11" should be -- claim 1 --.
Line 26, "coving" should be -- covering --.
Line 27, "claim 11" should read -- claim 1 --.

Signed and Sealed this

Ninth Day of July, 2002

Attest:

Attesting Officer

JAMES E. ROGAN
Director of the United States Patent and Trademark Office